(12) United States Patent
Rybczynski et al.

(10) Patent No.: US 12,444,636 B2
(45) Date of Patent: Oct. 14, 2025

(54) ELECTROSTATIC CHUCK WITH A CHARGE DISSIPATION STRUCTURE

(71) Applicant: ENTEGRIS, INC., Billerica, MA (US)

(72) Inventors: Jakub Rybczynski, Arlington, MA (US); Steven Donnell, Burlington, MA (US); Yan Liu, Lexington, MA (US); Caleb Minsky, Medfield, MA (US); Chandra Venkatraman, Tyngsboro, MA (US); Carlo Waldfried, Middleton, MA (US)

(73) Assignee: ENTEGRIS, INC., Billerica, MA (US)

( * ) Notice: Subject to any disclaimer, the term of this patent is extended or adjusted under 35 U.S.C. 154(b) by 219 days.

(21) Appl. No.: 18/113,941

(22) Filed: Feb. 24, 2023

(65) Prior Publication Data
US 2023/0274967 A1    Aug. 31, 2023

Related U.S. Application Data

(60) Provisional application No. 63/314,774, filed on Feb. 28, 2022.

(51) Int. Cl.
*H01L 21/683* (2006.01)

(52) U.S. Cl.
CPC ............................... *H01L 21/6833* (2013.01)

(58) Field of Classification Search
CPC ........... H01L 21/6833; H01L 21/67109; H01L 21/6831; H01L 21/6875; H01L 21/68757
USPC ........................................................ 361/234
See application file for complete search history.

(56) References Cited

U.S. PATENT DOCUMENTS

| | | | |
|---|---|---|---|
| 7,623,334 B2 | 11/2009 | Mizuno et al. | |
| 2004/0040665 A1* | 3/2004 | Mizuno | H02N 13/00 118/728 |
| 2008/0045010 A1* | 2/2008 | Wongsenakhum | H01L 21/76846 257/763 |
| 2008/0124926 A1* | 5/2008 | Chan | H01L 21/28562 257/E21.476 |
| 2009/0002913 A1* | 1/2009 | Naim | H02N 13/00 279/128 |
| 2009/0284894 A1* | 11/2009 | Cooke | H02N 13/00 438/700 |
| 2010/0284121 A1* | 11/2010 | Aruga | H01L 21/6875 361/234 |
| 2013/0155569 A1* | 6/2013 | Suuronen | H01L 21/6833 361/234 |
| 2014/0001576 A1* | 1/2014 | Gandikota | H01L 29/4941 257/412 |
| 2020/0161158 A1* | 5/2020 | Liu | B23Q 3/152 |

FOREIGN PATENT DOCUMENTS

| | | | |
|---|---|---|---|
| JP | 2016086080 A | 5/2016 | |
| TW | 200809999 A | 2/2008 | |
| WO | 2020214494 A1 | 10/2020 | |

* cited by examiner

*Primary Examiner* — Sreeya Sreevatsa

(57) ABSTRACT

Described are electrostatic chucks that are useful to support a workpiece during a step of processing the workpiece, the electrostatic chuck including a pattern of charge dissipation lines on an insulating layer, the lines having a first conductive layer and a second conductive layer and being arranged to define enclosed fields of the insulating layer between the lines.

19 Claims, 5 Drawing Sheets

ELECTROSTATIC CHUCK WITH A CHARGE DISSIPATION STRUCTURE

FIELD

This disclosure is in the field of electrostatic chucks that are useful to support a workpiece during a step of processing the workpiece, the electrostatic chuck including a charge dissipation system that includes conductive charge dissipation structure having at an upper surface of the chuck.

BACKGROUND

Electrostatic chucks (also referred to as "chucks," for short) are used in semiconductor and microelectronic device processing. A chuck holds in place a workpiece such as a semiconductor wafer, which includes microelectronic device substrates, to perform a process on a surface of the workpiece. The electrostatic chuck secures the workpiece to an upper surface of the chuck by creating an electrostatic attractive force between the workpiece and the chuck. A voltage is applied to electrodes that are contained within the multi-layer structure of the chuck to induce charges of opposite polarities in the workpiece and the chuck.

A chuck includes different structures, devices, and designs that allow the chuck to perform or that improve performance. Typical electrostatic chucks are in the form of multi-layer structures that includes: a flat upper surface of an insulating material that supports a workpiece; small embossments at the upper surface to create space between the upper chuck surface and a supported workpiece; electrical components such as electrodes to induce a charge in the chuck, and a connection to electrical ground; one or more cooling mechanisms for the chuck, the wafer, or both; measurement devices (e.g., to monitor a temperature), and a lifting mechanism ("lift pins") to separate a wafer from the upper chuck surface.

Another common feature is a charge dissipation system that includes a conductive coating at the upper surface that is connected to electrical ground and that during use contacts a bottom surface of the workpiece. During use, an electrostatic chuck provides a clamping action that attracts the workpiece toward the upper surface of the chuck to hold the chuck in place. The clamping action includes the use of an electrostatic force produced between the workpiece and the chuck. The force is generated by an electrode in the chuck that, when a voltage is applied to the electrode, induces an opposite electrostatic charge on the backside of the workpiece to attract the workpiece to the chuck. After performing a process on the workpiece, which the workpiece held against the chuck by the induced electrostatic attraction, the charge in the electrode is removed to remove the induced charge in the workpiece, which removes the clamping action and allows the workpiece to be removed from the chuck upper surface.

When the charge is removed from the electrode, the induced charge in the workpiece is expected to disappear to remove the electrostatic force between the electrode and the workpiece and allow the workpiece to be lifted and removed from the chuck. Often, however, due to material properties, chuck design, and process conditions, there is a measurable delay between the moment chuck is powered down (the charge on the electrode is removed) and a time at which the electrostatic charges are effectively removed from the workpiece and the chuck to allow the workpiece to be removed without significant resistance. This delay of complete dissipation of electrostatic charge of the chuck or the workpiece is an unfavorable event that leads to decreased process throughput and may result in wafer damage if the residual charge causes the workpiece to stick and become difficult to lift away from the chuck upper surface.

SUMMARY

Described as follows are "electrostatic chuck assemblies" in the form of multi-layer structures that include multiple structural, insulative, and electrically-functional layers assembled together to form a functioning electrostatic chuck, as well as precursors thereof.

An electrostatic chuck as described is designed to include a charge dissipation structure that includes an "array" or "lattice" of interconnected topographies or conductive lines (sometimes referred to as "traces") that are made of a two more layers of conductive materials ("multi-layer" charge dissipation lines) and are connected to electrical ground. The design of the array provides uniform surface coverage of the lines at a top surface of an electrostatic chuck and facilitates effective removal of charge from a supported workpiece and from the main field of the electrostatic chuck. The design also reduces the amount of interference that can be caused by the charge dissipation structure with the main function of the electrostatic chuck, which is to secure or "clamp" the workpiece to the upper surface of the electrostatic chuck during processing of the workpiece.

An electrostatic chuck provides clamping action of a workpiece by means of an electrostatic force induced in the workpiece by an electrode of the electrostatic chuck. This force is generated by an electrical charge induced on the bottom side of the workpiece by a voltage applied to an electrode of the electrostatic chuck. When the chuck is powered down, i.e., the charge on the electrode layer is removed, the charge induced in the workpiece is expected to disappear, thus eliminating the electrostatic force and allowing the workpiece to be easily lifted from the chuck.

But there is often a measurable delay between the moment that the charge is removed from the electrode layer, and all electrostatic charge is removed from the workpiece. To increase a rate of charge removal from a workpiece and a chuck, the chuck upper surface can include a highly-conductive layer that contacts the chuck and the workpiece and is connected to electrical ground. These layers are sometimes referred to as "charge dissipation layers or structure" Unfortunately, the conductive charge dissipation structure can directly interfere with the main chuck function, which is to secure the workpiece to the upper surface of the chuck; the interference is caused by the electrostatic force produced by the electrode layer couples with this conductive charge dissipation structure instead of supported workpiece.

According to this description, an upper surface of a chuck includes a charge dissipation structure that covers at least a small area of the main field, yet still provides highly efficient charge transport. Effective clamping action can be achieved through portions of the main field, which are relatively large areas not covered by the small-area charge dissipation structure.

Such an effective charge dissipation structure can be in the form of an array of lines built of interconnected high conductivity paths or interconnecting topographies that define and surround areas of the main field (areas of "exposed field") that are bound by the conductive coating. Clamping action remains unhindered at the areas of the enclosed field.

The charge dissipation structure may also incorporate an array of periodically-spaced mesas or "embossments" that protruding above the surface of the surface of the main field.

Additionally, or alternately, the charge dissipation structure may incorporate a raised vertical structure in the form of a "ridge" or "wall" that has a length and a width, and forms a circular ring that surrounds an area of the upper surface of the electrostatic chuck.

The charge dissipation structure includes two separate layers, a first conductive layer and a second conductive coating or layer ("a top layer or coating") disposed over the first conductive layer. In some embodiments, the first conductive layer has a higher conductivity and lower resistance than the second conductive layer, and accordingly, the second conductive layer has a lower conductivity and higher resistance than the first conductive layer. This combination of layers provides for highly efficient charge transport, with low contamination of the workpiece. A metal material for a charge dissipation structure is highly conductive, but can introduce elemental metal contamination to the workpiece. To allow a highly-conductive metal to be included as a component of the charge dissipation structure, the metal is covered and enclosed by a second conductive top layer. The conductive second layer is substantially free of any mobile metal ions or elemental species and sufficiently conductive to function as a conductive component of a charge dissipation structure, but is not prone to creating elemental metal contamination when used to support a workpiece. The top layer is conductive, and also functions to prevent any mobile metal ions or elemental species of the highly-conductive metal layer from introducing contamination to a workpiece.

An aspect of the invention includes, an electrostatic chuck comprising an insulating layer at an upper surface of the chuck. The chuck includes a charge dissipation structure on the insulating layer, the charge dissipation structure which includes a first conductive layer on the insulator layer having a first resistivity, and a second conductive layer over the first conductive layer, having a second resistivity, wherein the second the resistivity is higher than the first resistivity, wherein the charge dissipation structure comprising interconnecting topographies extending over the upper surface of the insulating layer, wherein between the interconnecting topographies there are exposed fields of the insulating layer, and one or more electrodes beneath the insulating layer, wherein the interconnecting topographies are located directly above the one or more electrodes.

Another aspect of the invention includes A method of producing an electrostatic chuck, which includes an insulating layer, forming a charge dissipation structure, the charge dissipation structure comprising: a first conductive layer on the insulator, the first conductive layer having a first resistivity, and a second conductive layer over the first conductive layer, the second conductive layer having a second resistivity, wherein the second resistivity is higher than the resistivity of the first conductive layer, and the charge dissipation structure comprising interconnecting topographies extending over the insulating layer upper surface, the interconnecting topographies defining exposed fields of the insulating layer between the lines.

Figure 1:
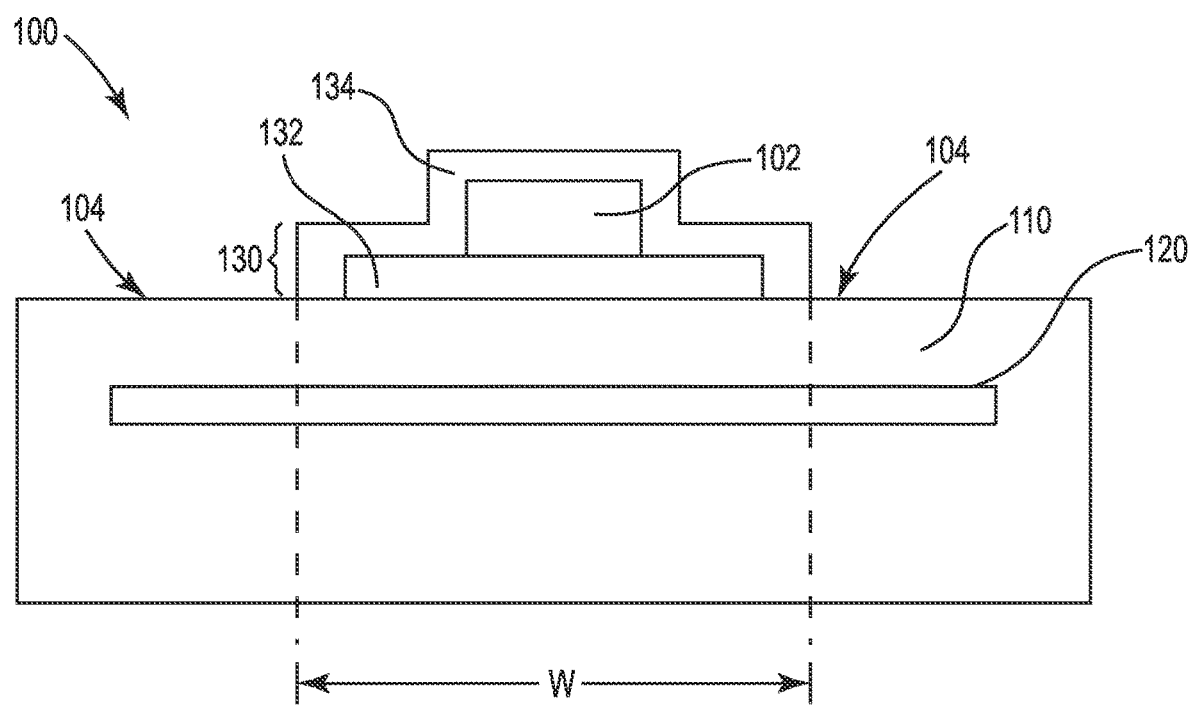
FIG. 1 is a side, cut-away view of an electrostatic chuck assembly as described.

All figures are schematic and are not necessarily to scale.

DETAILED DESCRIPTION

An "electrostatic chuck assembly" as described is a multi-layer device that includes multiple structural, insulative, and electrically-functional layers that are assembled together to form a functioning electrostatic chuck. The term "electrostatic chuck assembly" as used herein also refers to precursors or portions of a functioning electrostatic chuck, including combinations of layers and structures as described herein. The electrostatic chuck assembly (including precursors of a functioning electrostatic chuck) is sometimes referred to herein as a "chuck" or an "electrostatic chuck."

An upper portion of the chuck may be referred to as an "upper surface" (also referred to as a "workpiece-supporting surface") that includes: an insulating layer that has an upper surface that makes up a "main field" of the chuck, a "charge dissipation structure" that is disposed on the main field at the upper surface of the insulating layer, and embossments that may be located directly in contact with the insulating surface of the main field, or may be incorporated into the charge dissipation structure.

The "charge dissipation structure" includes at least two different layers or structures of conductive materials that are deposited as a stack on the surface of the main field. One conductive layer is a first layer that is a highly-conductive layer that is disposed directly onto the upper surface or "main field" of the insulating layer. A second conductive layer is a conductive top layer (or "top layer" for short, herein) that covers the highly-conductive layer.

Optionally, at multiple locations spaced along the length of a charge dissipation structure or layer, may be, embossments, and may be located above the first conductive layer (the highly-conductive layer) and below the second conductive layer (the top layer). As noted above, in some embodiments, the first conductive layer has a higher conductivity and lower resistance (resistivity) than the second conductive layer, and accordingly, the second conductive layer has a lower conductivity and higher resistance (resistivity) than the first conductive layer.

Also optionally, a structure of one or more seal rings may be incorporated into a charge dissipation structure. A seal ring may be located above the first conductive layer (the highly-conductive layer) and below the second conductive layer (the top layer), extending along a length of the charge dissipation structure. A seal ring is a structure in the form of a "ridge" or "wall" that has a length and a width, and forms a circular ring that surrounds an area of the upper surface of the electrostatic chuck. A "seal ring" forms a physical barrier at an outer edge and perimeter of the electrostatic chuck, or at a location that surrounds an aperture in the upper surface of the electrostatic chuck, such as to surround an aperture through which passes a lift pin.

A seal ring is designed to trap gas at an elevated pressure between a workpiece supported by a chuck and an area of the non-raised main field. The seal ring surrounds that area of the main field and maintains the gas at a desired pressure within the area of the main field, between the upper surface of the main field and the lower surface of the supported workpiece. The upper surface of the seal ring contacts the bottom surface of a workpiece; by incorporating a portion of a seal ring, or an entire length of a seal ring, into a charge dissipation structure, with conductive top coating at the upper surface of the seal ring, the conductive top coating contacts the bottom surface of the workpiece and allows electrostatic charge to pass from the workpiece to the conductive top coating, then to the highly-conductive layer, then to ground.

The charge dissipation structure is arranged at a top or second surface of the chuck in an array that includes interconnected segments or lines that intersect to form multiple enclosed geometric shapes that divide the main field into multiple enclosed shaped area of the field (areas of "enclosed field"). The lines, segments, or interconnecting topographies are configured to be multiple shaped, closed boundaries around multiple enclosed fields of a main field of the upper insulating layer. In some embodiments, the interconnecting topographies can be situated in a pattern. The shapes may be in any closed, geometric forms, such as the triangles (especially an equilateral or isosceles triangle), parallelograms (e.g., a rectangle, square, or rhombus), or hexagons. The shapes and exposed fields of a single array may optionally be all of the same dimensions and shapes. An array that includes a repeating pattern of equally-sized hexagon, such as a honeycomb pattern, may provide a preferred array by providing a desirably low maximum distance (dmax) between a charge dissipation interconnecting topograph(ies) and any point on an enclosed field, with a desirably low line width and total area of charged dissipation lines on an upper surface of an electrostatic chuck.

The workpiece-supporting surface includes embossments that are arranged over the surface to create space between the main field and a bottom surface of a workpiece supported by the workpiece-supporting surface. In use to support a workpiece using an electrostatic chuck, the workpiece rests not directly on the main field of the upper surface of the chuck, but rests on the small embossments arranged over the upper surface. The embossments have a height that creates a small space between the main field of the chuck and the bottom surface of the workpiece that is being supported. An embossment may be present at an upper surface of the chuck either directly on the main field, or as part of a multi-layer charge dissipation structure, e.g., between the highly-conductive layer and the conductive top layer.

Additionally or optionally, the workpiece-supporting surface may also include one or more seal rings. A seal ring has a height that creates a small space between the main field of the chuck and the bottom surface of the workpiece that is being supported. The seal ring will contact and support the bottom surface of the workpiece. A seal ring, or a portion of a seal ring, may be present at an upper surface of the chuck either directly on the main field, or as part of a multi-layer charge dissipation structure, e.g., between the highly-conductive layer and the conductive second layer.

The chuck assembly generally includes structures and components of the types normally included as a component of an electrostatic chuck assembly that allow the chuck to support a workpiece (e.g., semiconductor substrate, a microelectronic device, a semiconductor wafer, a precursor thereof) during processing, with an electrostatic attractive force holding the workpiece in place at the upper surface of the chuck. Example workpieces used with an electrostatic chuck include semiconductor wafers, flat screen displays, solar cells, reticles, photomasks, and the like. The workpiece may have an area equal to or greater than that of a circular 100 millimeter diameter wafer, a 200 millimeter diameter wafer, a 300 millimeter diameter wafer or a 450 millimeter diameter wafer.

The chuck includes a workpiece-supporting surface that is adapted to support a workpiece while the workpiece is processed. For supporting a circular workpiece that includes a semiconductor wafer that is circular, the workpiece-supporting surface can have a circular surface area with a circular edge that defines a circular perimeter, and that also defines a diameter of both the workpiece-supporting surface and the multi-layer chuck. For supporting different type of a workpiece that has a non-circular shape, the workpiece-supporting surface and the electrostatic chuck may have a noncircular shape that matches the shape different shape.

The workpiece-supporting surface includes the "main field," which is made of an insulating ceramic material, with embossments and the charge dissipation structure covering a portion of the main field, and dividing the main field into areas of enclosed fields. The workpiece is supported by the workpiece-supporting surface by embossments, which create a small space between the main field and the lower surface of the supported workpiece. At least some embossments on a workpiece-supporting surface are coated on their upper surfaces with a portion of the charge dissipation structure (e.g., the conductive top coating). That contact provides an electrical connection between the workpiece and the charge dissipation structure, to allow electrical charge to be exchanged between the workpiece and the charge dissipation structure.

The workpiece-supporting surface can include additional embossments that are not in contact with the charge dissipation structure but are directly in contact with the upper insulating layer, spaced from a charge dissipation line. These embossments provide support for a workpiece but do not function as part of the charge dissipation structure to remove charge from the workpiece.

The embossments may be sized and spaced as desired relative to a total surface area of an electrostatic chuck, and distributed over the upper surface the chuck in any manner that will be effective to support a workpiece during use. An example of a useful amount of area of embossments (total area of embossments relative to an area of a main field) may be not more than 10 percent of the area of the main field, e.g., not more than 8 or 5 percent of the total area of the main field.

Each embossment may have a useful diameter, with example diameters being in a range from about 0.5 millimeters to about 1.5 millimeters, e.g., from about 0.75 millimeters to about 1 millimeter. The shape of each embossment is three-dimensional, and may be any useful shape, such as a cylindrical shape with a circular upper surface. A height of an embossment may be any useful height, such as a height in a range from 5 or 10 microns up to 20, 30, 50, or 100 microns.

During use of the chuck in a step of processing a workpiece, the workpiece is held down against or "clamped" to the workpiece-supporting surface by an electrostatic attraction that is generated between the chuck and the workpiece. To produce the attraction, a charge (voltage) is applied to an electrode layer beneath the upper insulating layer. The charge that is applied to the electrode layer induces an opposite charge in the supported workpiece, and the charged workpiece becomes attracted to the oppositely-charged electrode and is drawn toward the upper surface of the chuck.

Example electrostatic chuck assemblies may operate as an AC or DC Coulombic chuck, or a Johnsen-Rahbek chucks.

A charge dissipation structure as described herein includes two different layers of conductive materials that are deposited as discrete layers, one laying on top of or disposed over the other layer (e.g., as a "vertical stack"), on the surface of the upper insulating layer and the main field. A first conductive layer, located on the bottom of the stack and directly contacting the surface of the upper insulating layer, is a highly-conductive layer. The highly-conductive layer can be selected to provide a very high level of conductivity, and may be made of a metal or metal alloy.

A metal material as a charge dissipation structure may be a source of contamination of a workpiece supported by the chuck, for example in the form of elemental metal contamination derived from the metal material. The contamination may be from physical interaction between the metal material and the workpiece. Contact between the workpiece and a metal charge dissipation structure may allow very small particles of the metal to break off of the charge dissipation structure, or may transfer to a surface of the workpiece. Alternately, mobile metal ions or mobile metal elemental species (at an atomic, ionic, or microscopic scale) may become contaminants by otherwise being transferred (e.g., by diffusion) from a metal charge dissipation structure to a workpiece.

To prevent this possible contamination by a metal material, a charge dissipation structure of the present invention includes a second conductive layer, referred to as a conductive second or layer (or "second/top layer" for short, herein) that covers and seals and encloses the highly-conductive metal layer that may prevent contamination of the workpiece by the metal. Having the second conductive layer, as described in this invention, can remove approximately 90% of the contamination by the metal material and in some instances 95%, and in other instances 98%. The conductive top layer is conductive, but to avoid potential contamination of the workpiece can be made of a non-metal, non-metal alloy material. The conductive top layer will be less conductive than a highly-conductive metal layer, but will presents a lower risk of introducing contamination to a workpiece.

As an additional method of preventing metal of a highly-conductive metal layer from contaminating a workpiece, an additional layer (a "barrier layer") may be included between the highly-conductive metal layer and the conductive top layer. A material of a conductive top layer may not prevent metals from a highly-conductive metal layer from diffusing from the metal layer and becoming exposed to a workpiece. Carbon-based and silicon-based materials such as DLC, Si, SiC, SiN, SiOx, etc., are not necessarily highly effective diffusion barrier materials for metals and metal ions. As an added barrier to prevent diffusion of metals or metal ions of the highly-conductive metal layer through a charge dissipation structure, and to prevent diffused metals or metal ions from contacting a workpiece, a diffusion barrier layer may be placed (e.g., deposited) between the metal layer and the top conductive layer. A diffusion barrier layer may be provided as a thin layer of ALD alumina (<250 nm (nanometers) or even <100 nm) deposited onto the metal layer, i.e., an alumina layer deposited over the metal layer by atomic layer deposition ("ALD"). The ALD diffusion barrier layer may be deposited over only the metal layer, over the entire charge dissipation structure (including the conductive top layer), or over the entire chuck surface (blanket layer, non-patterned) to provide a good barrier between the metal below and the work piece above.

During use, an upper insulating layer of a chuck, as well as a lower surface and portion of a workpiece that is supported by the chuck, will each exhibit an electrostatic charge. The highly-conductive layer of the charge dissipation structure may be connected to ground, optionally through a switch. A connection to ground may be provided by an electrical lead that passes from the charge dissipation structure to a lower/first layer of the chuck, by any route. An example route of a grounding lead may be vertically through an opening in the upper insulating layer. A different example route of a grounding lead may be vertically along a side of the upper conductive layer. In alternate examples, the charge dissipation structure need not be connected to electrical ground but could instead be injected with a reverse charge (relative to a residual electrostatic charge a workpiece or upper insulating layer) to balance a residual charge and allow for removal of a workpiece from the electrostatic chuck.

The charge dissipation structure functions to remove the electrostatic charge at a desired time during processing from both the main field of a chuck and the workpiece, by allowing the charge in the main field and in the workpiece to be conducted to electrical ground through the electrically-conductive charge dissipation structure.

The charge dissipation structure, at least the first conductive layer thereof (i.e., the highly-conductive layer), is in direct contact with the main field. An electrostatic charge that is present in the main field of the chuck, i.e., in the upper insulating layer, can be drained (removed or dissipated) from the main field through the highly-conductive layer, to ground.

The charge dissipation structure can also drain charge from a workpiece that is supported by the chuck. The charge dissipation structure, being located to cover embossments on the upper support layer, contacts the bottom surface of the workpiece during use. An electrostatic charge that is present at the bottom surface of the workpiece can be drained (removed or dissipated) from the workpiece through the conductive top layer, which also contacts the highly-conductive layer, which connects to electrical ground.

As an example, FIG. 1 illustrates a cross-sectional view of an upper surface or "chuck-supporting surface" of an electrostatic chuck assembly as described. Chuck assembly (or "chuck" for short) 100 includes upper insulating layer 110 with a top surface that forms main field 104. Charge dissipation strucutre 130 includes first conductive layer 132 (the highly or more conductive layer), and second conductive layer 134 (also referred to as a "top layer) disposed on or over the first conductive layer 132 First conductive layer 132 is connected to ground (not shown), optionally through a switch. Embossment 102 is shown as being formed on an upper surface of first conductive layer 132, and beneath and enclosed by top coating layer 134; note that at other locations along a length of a line of a charge dissipation structure 130, where an embossment 102 is not present, top coating layer (or second conductive layer) 134 will contact the entire top surface of first conductive layer 132 and completely cover the top surface of first conductive layer 132. Also shown, electrode layer 120 is located below the main field, including with a portion of electrode layer 120 being located directly beneath (vertically beneath) charge dissipation structure 130.

Generally, first conductive layer 132 is made of a deposited layer of material that has very high conductivity and a low resistivity, for example, but not limited to, a resistivity of a metal or metal alloy, which may be less than $1 \times 10^{-5}$ ohm-meter, less than $1 \times 10^{-6}$ ohm-meter, less than $1 \times 10^{-5}$ ohm-meter, or in in a range from $1\times10^{-8}$ to $1\times10^{-5}$ ohm-meter, which may be dependent on the temperature which ranges from about 20 degrees Celsius to about 100 degrees Celsius. A typical material for a highly-conductive layer may be a highly pure metal or highly pure metal alloy made of at least 90, 95, 99, or 99.9 percent of one or more metals. Useful metals include aluminum and nickel, which may be used alone or in combination as an alloy of two or more of these, optionally with other metals also included in an alloy.

A highly-conductive layer may have any thickness (i.e., the height of the layer above the surface of the upper insulating layer) that is useful to form a useful charge dissipation structure, e.g., having a desired level of electrical conductivity. Example thicknesses may be in a range from 200 to 500 nanometers, but thicknesses outside of this range may also be useful.

While a metal or metal alloy used as a highly-conductive layer is desired for high electrical conductivity, a metal or metal alloy may be a source of contamination of a workpiece that is supported by the chuck, especially if the metal or metal alloy contacts the workpiece. Metals and metal alloys can produce particles or may otherwise transfer from a chuck that contains the metal or metal alloy to a bottom surface of a workpiece that is supported by the chuck with contact between the metal or metal alloy and the chuck.

To allow the use of a highly-conductive metal material as a component of a charge dissipation structure, while reducing or preventing the metal material from being a source of contamination to the workpiece, the highly-conductive layer is covered by the conductive second layer to prevent the metal of the highly-conductive layer from contacting the workpiece or otherwise introducing a metal contaminant to the workpiece. The metal of the highly-conductive layer is prevented from contacting the workpiece by the conductive top layer being placed over the highly-conductive metal layer, preferably to entirely seal the highly-conductive (metal) layer under a continuous coating of the conductive top layer. See FIG. 1, which illustrates charge dissipation structure 130 as having highly-conductive layer 132 entirely covered on the top and sides by top coating 134.

Second conductive layer 134 is placed over the first conductive layer 132, and also over embossments (e.g., 102) that are incorporated into the charge dissipation structure at selected positions of the charge dissipation structure. Coating the second conductive layer over embossments causes the second conductive layer to contact a bottom side of a supported workpiece during use of the chuck. The second conductive layer is made of a deposited material that is conductive, to be effective to allow an electrostatic charge to pass from the supported workpiece, through the second conductive layer, to the highly-conductive layer (the first conductive layer), and then to ground. The second conductive layer is also selected to be of a type of material that may contact the workpiece with a reduced risk of contamination of the workpiece relative to a metal or metal alloy, preferably with a very low risk of contamination of the workpiece upon contact of the workpiece with the conductive top layer.

As such, a material of a conductive second layer is chosen to have a conductivity that is less than a conductivity of a metal, while reducing the potential for contaminating the workpiece. By selecting a top layer material that does not require the high level of conductive of a metal, the top layer can be selected to be a material that will have a reduced risk of contaminating a supported workpiece compared to a layer of pure metal or metal alloy.

Example conductive top layers may be made of conductive materials that are not pure metal or pure metal alloy, and that have a resistivity (at about 20 degrees Celsius but can be measured to 100 degrees Celsius.) of less than $1\times10^{-2}$ ohm-m, less than $1\times10^{-3}$ ohm-meter, less than $1\times10^{-4}$ ohm-meter, or in a range from $1\times10^{-5}$ to $1\times10^{-2}$ ohm-meter. A typical material for a conductive top layer may be a conductive polymer materials, conductive glass materials, conductive carbon-based materials, and conductive silicon-based material. Examples include materials made of at least 95, 99, or 99.9 percent conductive polymer, conductive glass, silicon carbide, carbon-nitrogen (e.g., nitrogen-based carbon), diamond-like carbon (DLC). Another example is a conductive nitride material such as titanium nitride.

A conductive second layer may have any thickness (i.e., the height of the layer above the surface of the upper insulating layer) that is useful to form a useful charge dissipation structure. Example thicknesses may be in a range from 500 to 1500 nanometers, but thicknesses outside of this range may also be useful. Thickness of the conductive second layer may be different at horizontal and vertical portions of the conductive second layer. A thickness measurement as specified may be measured at a horizontal portion of the layer.

The charge dissipation structure, which includes the highly-conductive layer and the conductive second layer, is conductive, to allow an electrical charge present in a workpiece that contacts the second conductive layer to pass through the conductive second layer and through the highly-conductive layer, to electrical ground. The combined resistance of the layers of the charge dissipation structure can be effective to allow the layers to perform as described. Example charge dissipation structures may have a measured resistance of a less than $1\times10^7$ ohms, such as less than $1\times10^6$ ohms. This measured resistance of the multi-layer charge dissipation structure is measured as a resistance between two points on a line of an array of charge dissipation structure, across a longest length of a line of the array.

The charge dissipation structures and any additional structure or layers thereof can be formed on the surface of the main field in a patterned geometric array, which includes lines or interconnecting topographies that form closed, geometric shapes such as triangles (especially equilateral or isosceles triangles), parallelograms (e.g., a rectangle, square, or rhombus), or a hexagons.

In preferred examples, an array of lines or interconnecting topographies of a charge dissipation structure can be designed to provide a desired balance between different performance properties of a chuck, including by balancing: effective and rapid dissipation of charge of a main field and a supported workpiece; and a desirably low or minimum amount of interference by the charge dissipation structure performance of the electrode layer to induce a charge in a supported workpiece to clamp the workpiece against the upper surface of the chuck.

To reduce the degree of interference with the strength of a clamping action of the chuck, the size, i.e., area, of the charge dissipation structures can be reduced or minimized. The width of the lines and the total area of the lines of a charge dissipation structure that covers the main field can be reduced or minimized. On the other hand, to increase the efficiency and speed of dissipating a charge from the main field or the supported workpiece, the distance between lines and the maximum distance (dmax) between a line and any point on the main field should be reduced or minimized, meaning the array includes a greater number of lines. Also to increase efficiency and speed of charge dissipation, the conductivity of the charge dissipation structure, both the highly-conductive layer and the conductive second layer, can be increased or maximized.

A useful array of charge dissipation interconnecting topographies may be arranged at a top surface of the chuck, covering a portion of the main field of the upper insulating layer, in an pattern that includes electrically interconnected lines that intersect to form multiple exposed geometric shapes. The lines are electrically "interconnected," meaning that lines of the array are electrically connected at multiple points of intersection within the array, at a location on top of the two-dimensional upper layer of the chuck assembly (not merely via a common grounding layer at a location below the upper insulating layer).

The lines or interconnecting topographies can be made to be relatively thin and relatively small in area in terms of the amount (percent) of area of the lines that cover the main field. Desirably, the total size (area) of lines of the charge dissipation structure is designed to be small or low, to cover a low percent of the area of the main field. A width (w) and total area of the charge dissipation lines are desirably kept low or to a minimum, to reduce the interference caused by the lines on the strength of the clamping function of the chuck.

Example widths of a charge dissipation structure can be in a range from 0.1 to 1.5 millimeters, e.g., from 0.3 to 1.0 millimeters, and any and all ranges and subranges therebetween.

Alternately or additionally, the area of an array of interconnecting topographies relative to an area of a main field may be a total area of the interconnecting topographies on the charge dissipation structures that is less than 15, 10, or 5 percent of a total area of the main field (i.e., the total area of the surface of the upper insulating layer).

Desirably, to allow for rapid charge dissipation of the insulating material of a main field of an electrostatic chuck, every point on the main field should be not less than a desired maximum distance (dmax) from a charge dissipation line. A distance dmax can be selected based on various factors that include: a width of charge dissipation lines, an area of an exposed field between the interconnecting topographies, and conductivity of the material of the upper insulating layer. Examples of useful maximum distances (dmax) between any point on the surface of the upper insulating layer (main field) and a charge dissipation interconnecting topographies may be not more than 20 millimeters, preferably not more than 10 or 15 millimeters, for example in a range between 2, 3, or 5 millimeters and 10, 15, 20 millimeters.

The interconnected topographies preferably form a repeating pattern of multiple closed, similarly-sized and similarly-shaped geometric "enclosed fields" of the main field. The interconnecting topographies surround and define a pattern of multiple regularly-positioned "exposed fields" that extend across the area of the main field. The lines form multiple closed (continuous, un-interrupted) boundaries that surround each of the shaped exposed fields of the main field. In some embodiments, an area of the lines is less than 10 percent, less than 9 percent, less than 8 percent, less than 7 percent, or less than 6 percent of the total area of an upper surface of the chuck and an area of the enclosed fields is at least 90 percent, at least 91 percent, at least 92 percent, at least 93 percent, or at least 94 percent of the total area of the upper surface of the chuck.

The form of the shapes may be any useful closed, geometric form. According to presently-preferred examples, each side of an enclosed field may be a straight line as opposed to a curved line, although curved lines may also be effective. Also as presently preferred, all shapes of a pattern defined by an array are identical in size and form. Example shapes include repeating triangles (especially equilateral or isosceles triangles), parallelograms (e.g., a rectangles, squares, or rhombuses), and hexagons.

FIGS. 2A, 2B, 2C, and 2D are top views of example electrostatic chuck assemblies as described. These figures depiction example upper surfaces that include a main field and an array of interconnecting topographies as described, disposed over and covering a portion of the main field and dividing the main field into shaped enclosed fields. The interconnecting topographies include: a highly-conductive layer, a conductive top layer that covers the highly-conductive layer, and embossments at spaced locations along lengths of the charge dissipation lines.

Figure 2A:
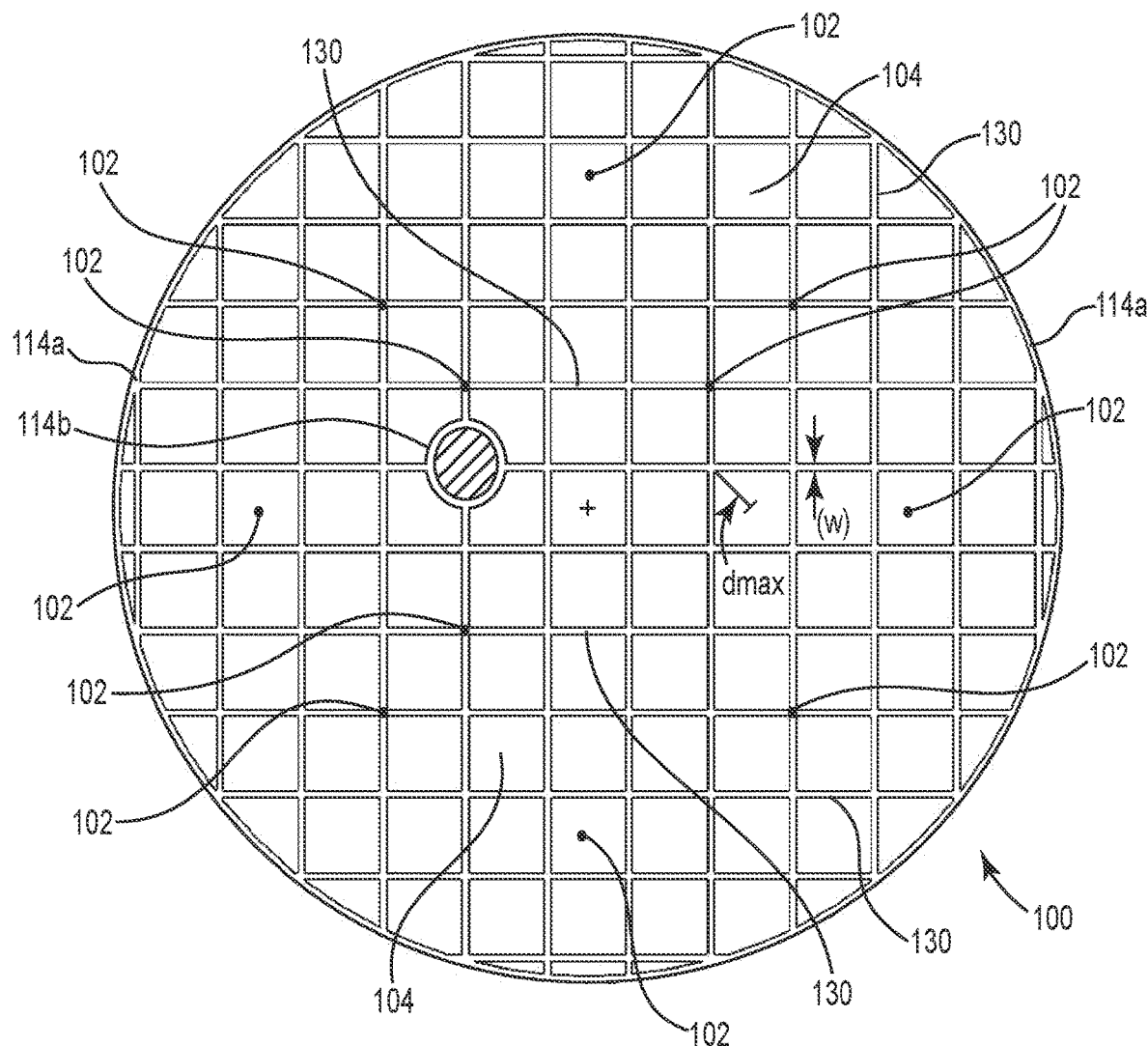
FIGS. 2A, 2B, 2C, and 2D are top views of example electrostatic chuck assemblies as described, including a depiction of an upper surface that includes a main field and an array of charge dissipation lines as described.

Referring to FIG. 2A, depicted is an upper surface of an electrostatic chuck assembly as described, e.g., assembly 100 of FIG. 1A. Chuck assembly 100 includes a main field 104 divided by of interconnecting topographies 130 into enclosed fields of individual square shapes. Embossments 102 can be located at a position where the embossments are incorporated into the interconnecting topographies 130, as shown at FIG. 1. Additional embossments 102 may be located away from interconnecting topographies 130, directly on main field 104, within an enclosed field. A seal ring 114a is located at a perimeter of the upper surface of chuck assembly 100. A smaller seal ring 114b is located on main field 104, surrounding an opening in main field 104.

As illustrated at FIG. 2A, an array of interconnected interconnecting topographies 130 is arranged to form multiple geometric (square) enclosed fields of main field 104. The width (w) of the lines can be relative narrow, such as a width in a range from 0.1 to 1.5 millimeters, e.g., from 0.3 to 1.0 millimeters. The total area of the interconnecting topographies may preferably be significantly less than the total area of main field 104, meaning the total area of the upper surface of upper insulating layer 110. For example, the total area of charge dissipation lines 130 may be less than 15, 10, 8, or 5 percent of a total area of the upper surface of upper insulating layer 110, (this total area includes the area of lines 130 plus the area of the complete and partial square enclosed fields formed between the lines 130).

Optionally and as illustrated, seal ring 114a at the perimeter of assembly 100 is incorporated into charge dissipation lines 130. In cross-section, interconnecting topographies 130 at the perimeter of assembly 100 include a first conductive layer, a "ridge" that extends along the length of the perimeter to form seal ring 114a, and a second conductive layer disposed over the ridge that forms the seal ring. Smaller seal ring 114b, which surrounds an opening on main field 104, includes portions that are incorporated into charge dissipation lines 130.

Figure 2B:
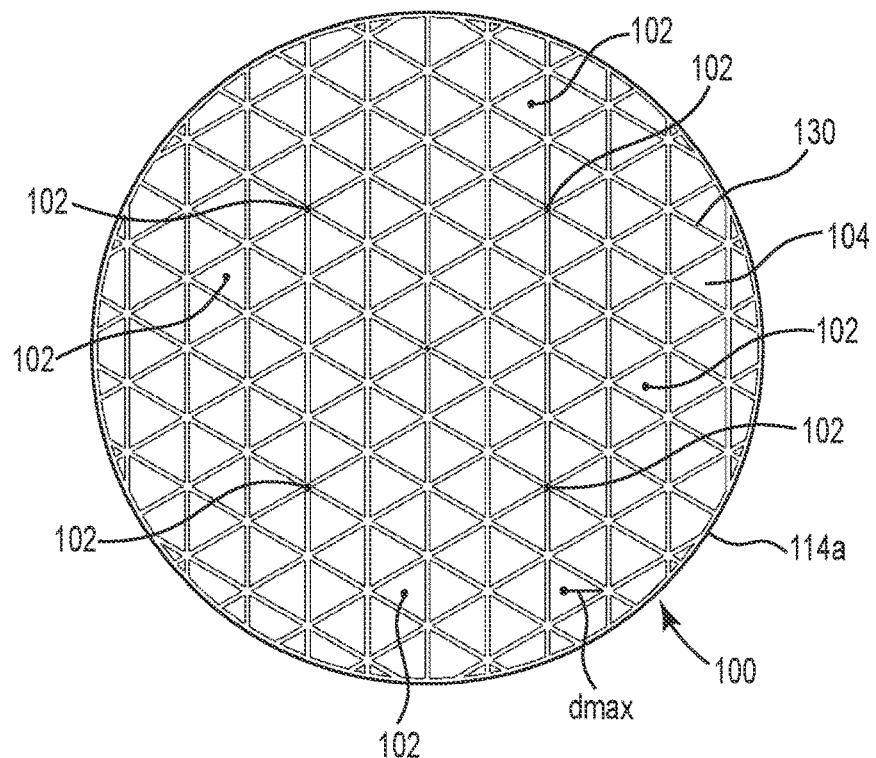

FIG. 2B illustrates an array an array of interconnected topographies 130, which form enclosed fields that are equilateral triangles.

Figure 2C:
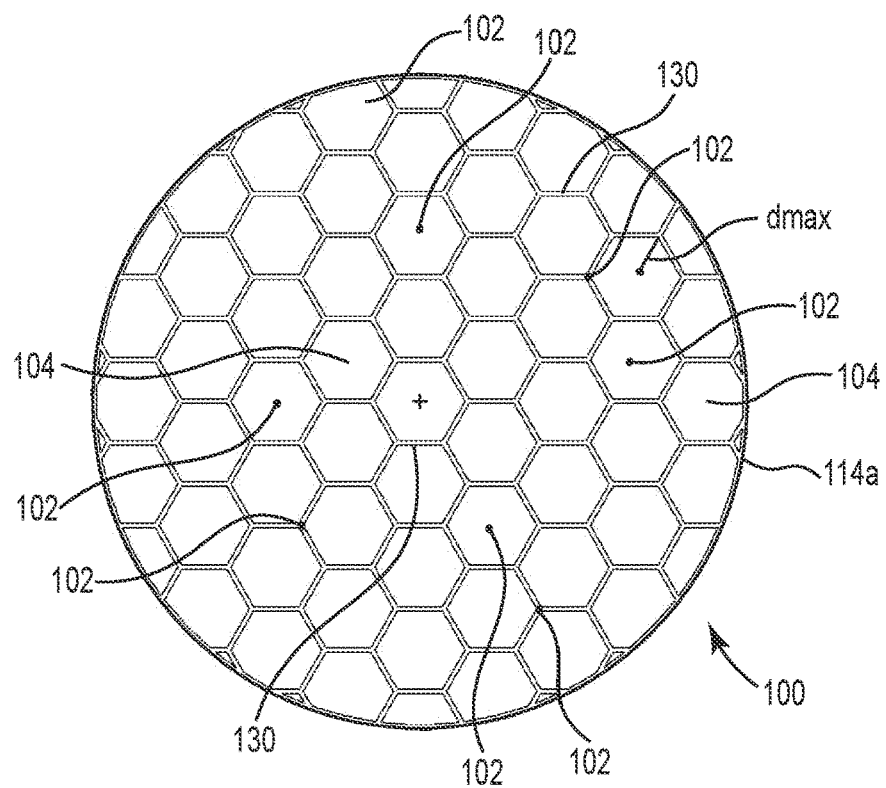

FIG. 2C illustrates an array an array of interconnecting topographies 130, which form enclosed fields that are hexagons.

Figure 2D:
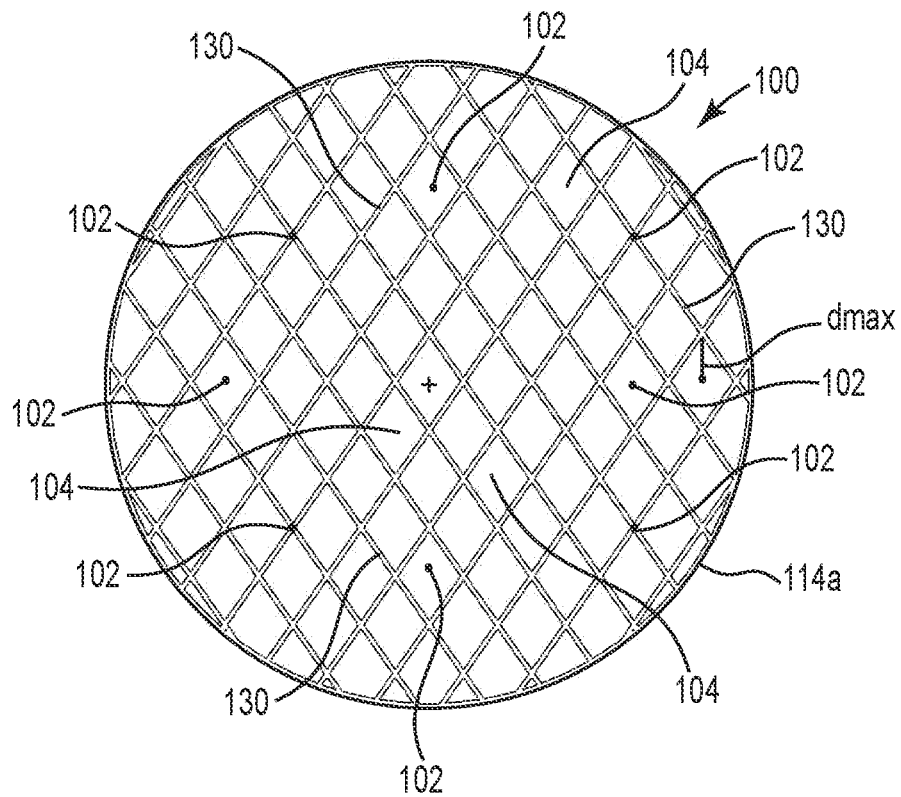

FIG. 2D illustrates an array an array of interconnecting topographies 130, which form enclosed fields that are parallelograms, specifically rhombuses.

FIGS. 2A through 2D show lines of a charge dissipation structure over a main field of an upper insulating layer. These figures do not illustrate a position of electrodes located beneath the upper insulating layer relative to the array of lines of the charge dissipation structure.

Figure 3:
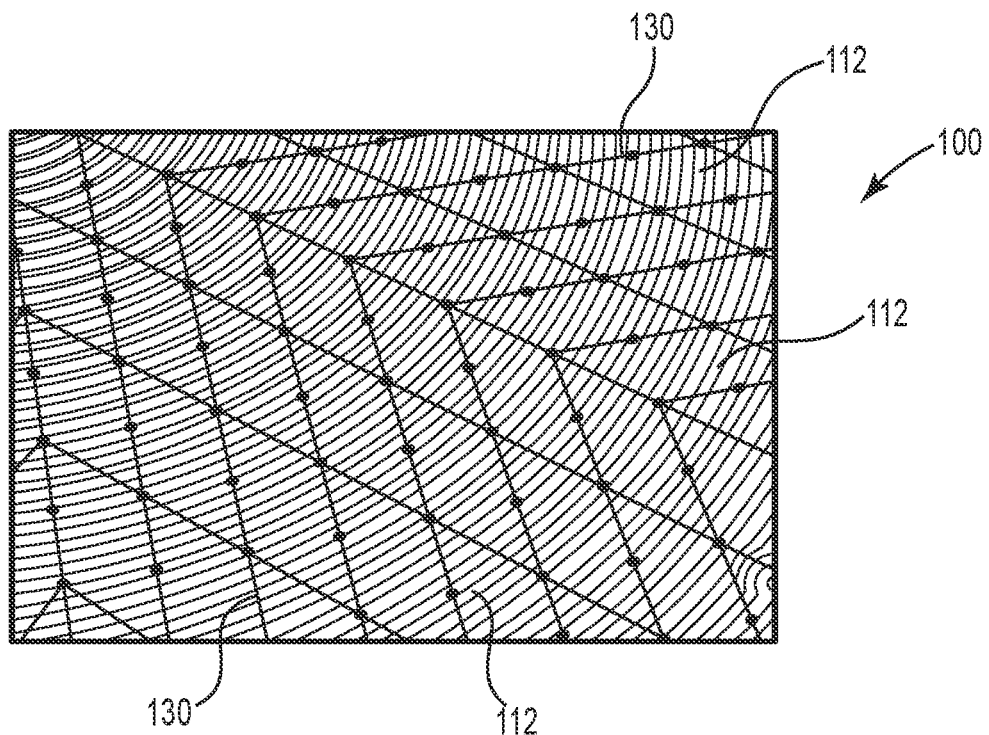
FIG. 3 is a top perspective view of an electrostatic chuck assembly as described, depicting a main field, and the relative locations of electrode lines of an electrode layer below an upper insulating layer, and interconnecting topographies of a charge dissipation structure located above an upper insulating layer.

Generally, according to useful and preferred examples of chuck assemblies, an array of electrodes is located beneath the upper insulating layer, with the array of electrodes being located to include lines of the electrode located vertically below lines of the charge dissipation structure. FIG. 3 illustrates this arrangement, with lines 130 (arranged to form enclosed fields in the shape of parallelograms) of charge dissipation structure being arranged vertically above lines 112 of an electrode positioned below the upper insulating layer of chuck assembly 100. The arrangement of lines of the charge dissipation structure, as well as the arrangement of the embossments, is independent of the arrangement of a pattern of electrodes of the electrode layer; lines of the charge dissipation structure may be vertically overlapping with lines of electrodes of an electrode layer.

The charge dissipation structure, and the components of the charge dissipation structure, including the highly-conductive layer, the conductive second layer, and embossments, may each be formed using separate but successive deposition steps to deposit these structures, successively, onto the surface of the main field. Any useful techniques for forming and applying these structures may be used. Examples include deposition techniques, e.g., chemical vapor deposition, plasma-enhanced chemical vapor deposition, or a similar technique.

A metal (including metal alloys) highly-conductive layer may be formed by a range of different known methods of depositing metal materials. Examples include sputtering, e-beam evaporation, and thermal evaporation techniques.

Likewise, a conductive second layer of a charge dissipation structure may be formed by a range of different known methods of depositing metal materials. According to presently-preferred examples, a conductive second layer may include diamond-like carbon (also referred to as "DLC"). Diamond-like carbon is a known material, sometimes referred to as "CVD diamond" (i.e., diamond deposited by chemical vapor deposition). Diamond-like carbon is a type or class of amorphous carbon material that has properties similar to diamond, and that contain a mixture of both sp2 and sp3 carbon-carbon interatomic bonds. Diamond-like carbon can be deposited onto a substrate using any of various deposition methods, including chemical vapor deposition (CVD), plasma-enhanced chemical vapor deposition (PECVD), and physical vapor deposition (PVD), among others. The diamond-like carbon may be deposited at a relatively high purity, such as by being formed of at least 90, 95, 98, or 99 percent (atomic) carbon atoms.

Optionally, as desired, physical or electrical properties of diamond-like carbon can be adjusted by including an atomic dopant, impurity, or other additive within the diamond-like carbon structure when preparing the material by deposition, such nitrogen atoms as a dopant.

Embossments and sealing ring structures may be deposited as insulating or semiconducting materials such as silicon-based materials. These are well known solid materials that contain a substantial amount of silicon in combination with one or a combination of carbon atoms, oxygen atoms, and nitrogen atoms. A useful or preferred deposited silicon-based material may be made substantially of or entirely of silicon atoms combined with one or a combination of carbon, oxygen, and nitrogen atoms, e.g., will contain at least 90, 95, 98, 99, or 99.5 percent (atomic) silicon, carbon, oxygen, and nitrogen atoms.

Examples of known deposited silicon-based materials include silicon nitride (SiN), silicon carbide (SiC), silicon oxide (e.g., silicon dioxide, SiO2), and silicon oxynitride (SiON). These materials may be deposited as an embossment structure using any of various deposition methods, including chemical vapor deposition (CVD), plasma-enhanced chemical vapor deposition (PECVD), physical vapor deposition (PVD), among others. A silicon-based material may be pattern coated using any of various known pattern-coating techniques such as photolithography.

A functioning chuck assembly (or "chuck" for short) includes a number of other layers, devices, structures, or features, in addition to an insulating layer, charge dissipation structure, embossments, etc., that are important for the chuck to function. These include: an electrode layer that generates an electrostatic attraction between the chuck and the workpiece to hold the workpiece in place during processing; a grounding device such as a grounding layer and related electrical connections; measurement devices for measuring pressure, temperature, or an electrical property during a processing step; gas flow conduits as part of a temperature control function; a conductive surface coating; as well as others.

The upper insulating layer may be made of a useful insulating material such as a ceramic material, e.g., alumina, aluminum nitride, quartz, SiO2 (glass), among others. The upper insulating layer will have a high resistivity. A resistivity that is typical of a ceramic or insulating material for use as an upper insulating layer can have a resistivity of at least $1\times10^{12}$ ohm-m, or at least $1\times10^{13}$ ohm-m or $1\times10^{14}$ ohm-m.

A useful upper insulating layer may be made of a single (integral) layer of material, or may alternately be made of two or more different materials, e.g., multiple layers of different materials, if desired. A thickness of a ceramic layer (having one or multiple layers of ceramic materials) may be any effective thickness based on factors relating to the insulating material, the type of chuck, and desired performance properties of the chuck.

Layers of the chuck are supported below by a base layer ("base" for short), which is typically made of metal, such as aluminum, aluminum alloy, titanium, stainless steel, ceramic such as alumina, a metal matrix composite, among others.

Typically between the upper insulating layer and the base is one or more of: a bonding layer (e.g., a polymeric adhesive), an electrode, a grounding layer, an insulating layer that allows the electrodes and other layers to function electrically, or additional circuitry.

Figure 4:
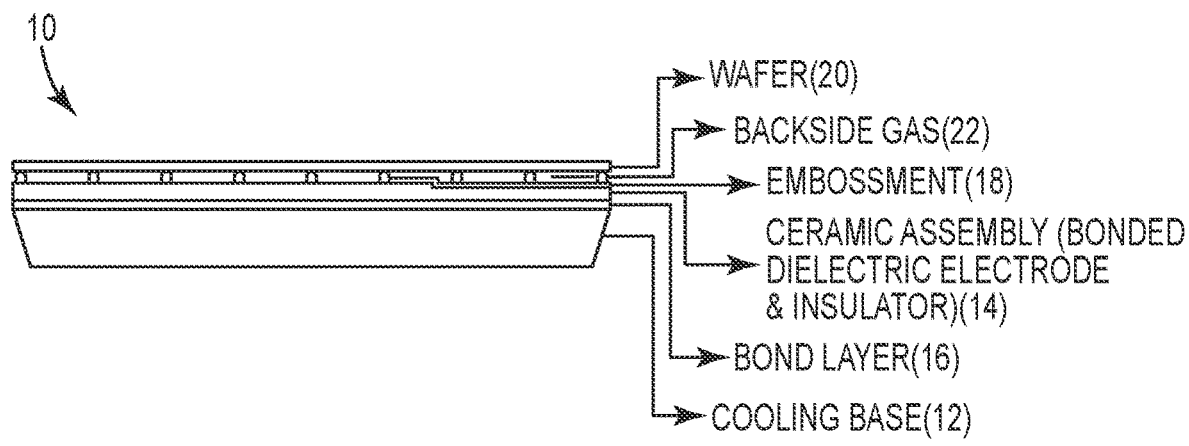
FIG. 4 is a side view of an electrostatic chuck assembly as described.

An example of a useful chuck assembly is shown at FIG. 4. Chuck assembly 10 includes base 12, ceramic layer ("assembly") 14, and a bonding layer 16 that bonds an upper surface of base 12 to a bottom or lower surface of ceramic layer 14. Ceramic layer 14 also includes an electrode (not specifically shown) disposed at the bottom surface. At an upper surface of ceramic layer 14 is a pattern of embossments 18. As illustrated, a workpiece (shown as wafer 20) is supported by the embossments. A space 22 is present between a lower surface of wafer 20 and an upper of ceramic layer 14. Space 22 is created by embossments 18 located at the upper surface of ceramic layer 14, which support wafer 20 at a slight distance above the upper surface of ceramic layer 14. The space can allow for the workpiece to be cooled by a gas that contacts the bottom or backside of the workpiece.

A chuck assembly as described may be used in equipment and processes useful for processing a workpiece using any of various known processing steps that involve the use of an electrostatic chuck. The described chuck and related methods may be particularly useful for semiconductor wafer processing, but may also be used for other processes. Examples of equipment and systems with which an electrostatic chuck may be used include: beam line ion implanters, plasma doping ion implanters, plasma immersion ion implantation systems, flood ion implanters, focused plasma systems, systems that modulate a plasma sheath, etching systems, optical based processing systems, chemical vapor deposition systems, coating systems, etching systems, lithography systems, and other devices and tools useful for processing semiconductor and microelectronic devices.

Processes or uses of an electrostatic chuck as described can involve using the chuck for chucking (attraction) and dechucking (release) of a substrate or workpiece. Processes or uses can include those that result in the addition or generation of heat to the workpiece. In some processes a workpiece is held in a reduced pressure environment in a vacuum chamber while engaged by the chuck, for example during reactive ion-etching (RIE), plasma etching, ion-beam etching, etching, physical vapor deposition (PVD), chemical vapor deposition (CVD), or other processes. During use, or during a process, an electrostatic chuck may, for example, retain a substrate in a chucking step; undergo a coating, implant or other treatment; and then release the substrate in dechucking step. These steps or acts may be repeated.

In a first aspect, an electrostatic chuck comprises an insulating layer at an upper surface of the chuck, a pattern of charge dissipation lines on the insulating layer, the charge dissipation lines comprising: a first conductive layer on the insulator, the first conductive layer having a resistivity at 20 degrees Celsius of less than $1 \times 10^{-5}$ ohm meter, or less than $1 \times 10^{-6}$ ohm meter, or even less than $1 \times 10^{-8}$ ohm meter, and, a second conductive layer over the first conductive layer, the second conductive layer having a resistivity that is higher than the resistivity of the first conductive layer, the pattern comprising lines extending over the insulating layer upper surface, the lines defining enclosed fields of the insulating layer between the lines, and one or more electrodes beneath the insulating layer, wherein the pattern of charge dissipation lines includes lines located vertically above an electrode. In some instances the second conductive layer can have a resistivity that is at least 10 times higher than the first conductive layer. In other instances, this can 15 times higher or even 20 times higher.

In a second aspect according the first aspect, the second conductive layer has a resistivity below $1 \times 10^{-2}$ ohm meter.

In a third aspect according to any of the preceding aspects, the enclosed fields comprises closed geometric shapes.

In a fourth aspect according the third aspect, the shapes are selected from: rectangles, squares, rhombuses, triangles, hexagons, and a combination thereof.

In a fifth aspect according to any of the preceding aspects, a charge dissipation line has a total resistance below $1 \times 10^{7}$ ohms measured across a longest length of the charge dissipation lines.

In a sixth aspect according to any of the preceding aspects, a maximum distance between any location of an exposed field and a line of the array is less than 20 millimeters.

In a seventh aspect according to any of the preceding aspects, a maximum distance between any location of an exposed field and a line of the array is in a range of 2 to 15 millimeters.

In an eighth aspect according to any of the preceding aspects, the lines have a width in a range from 0.1 to 1.5 millimeters.

In a ninth aspect according to any of the preceding aspects, the first conductive layer comprises aluminum, nickel, or a combination thereof.

In a tenth aspect according to any of the preceding aspects, the first conductive layer has a thickness in a range from 200 to 500 nanometers.

In an eleventh aspect according to any of the preceding aspects, the second conductive layer comprises conductive material selected from diamond-like carbon, silicon carbide, doped carbon, and titanium nitride.

In a twelfth aspect according to any of the preceding aspects, the second conductive layer has a thickness in a range from 500 to 1500 nanometers.

In a thirteenth aspect according to any of the preceding aspects, an area of the lines is less than 10 percent the total area of the upper surface of the chuck, and an area of the enclosed fields is at least 90 percent the total area of the upper surface of the chuck.

A fourteenth aspect according to any of the preceding aspects, further comprises one or more embossments disposed on an upper surface of the insulating layer, spaced from charge dissipation lines.

A fifteenth aspect according to any of the preceding aspects, further comprising embossments disposed on the first conductive layer, wherein the second conductive layer disposed over the embossments.

A sixteenth aspect according to any of the preceding aspects, further comprising a seal ring disposed on the first conductive layer, wherein the second conductive layer disposed over the seal ring.

A seventeenth aspect according to any of the preceding aspects, further comprising a barrier layer disposed between the first conductive layer and the second conductive layer.

In an eighteenth aspect a method of producing an electrostatic chuck comprises: on an insulating layer, forming a pattern of charge dissipation structure, the charge dissipation structure comprising: a first conductive layer on the insulator, the first conductive layer having a first resistivity a second conductive layer over the first conductive layer, and the second conductive layer having a second resistivity that is higher than the resistivity of the first conductive layer, and the interconnecting topographies extending over the insulating layer upper surface, the interconnecting topographies defining exposed fields of the insulating layer between the interconnecting topographies.

In a nineteenth aspect according to the eighteenth aspect, the charge dissipation structure comprise: the first conductive layer, embossments disposed on the first conductive layer, and the second conductive layer over the first conductive layer and the embossments.

In a twentieth aspect according to the eighteenth or nineteenth aspect, the charge dissipation structure comprise: the first conductive layer, a seal ring or portion of a seal ring disposed on the first conductive layer, and the second conductive layer over the first conductive layer and the seal ring or the portion of a seal ring.

In a twenty-first aspect according to any of the eighteenth through twentieth aspects, the electrostatic chuck comprises one or more electrodes beneath the insulating layer, wherein the interconnecting topographies includes lines located vertically above an electrode.

A twenty-second aspect according to any of the eighteenth through twenty-first aspects, further comprising: depositing the first conductive layer on a surface of the insulating layer, depositing embossments on the first conductive layer, and depositing the second conductive layer over the first conductive layer and the embossments.

In twenty-third aspect according to any of the eighteenth through twenty-second aspects, the second conductive layer has a resistivity below $1 \times 10^{-2}$ ohm meter.

In a twenty-fourth aspect according to any of the eighteenth through twenty-third aspects, the enclosed fields comprise shapes selected from: rectangles, squares, rhombuses, triangles, hexagons, and a combination thereof.

In a twenty-fifth aspect according to any of the eighteenth through twenty-fourth aspects, a charge dissipation line has a total resistance below $1\times10^7$ ohms measured across a longest length of the charge dissipation lines.

In a twenty-sixth aspect according to any of the eighteenth through twenty-fifth aspects, a maximum distance between any location of an exposed field and a line of the array is less than 25 millimeters.

In a twenty-seventh aspect according to any of the eighteenth through twenty-sixth aspects, wherein the first conductive layer comprises aluminum, nickel, or a combination thereof.

In a twenty-eighth aspect according to any of the eighteenth through twenty-seventh aspects, the second conductive layer comprises conductive material selected from diamond-like carbon, silicon carbide, doped carbon, and titanium nitride.

In a twenty-ninth aspect according to any of the eighteenth through twenty-eighth aspects, an area of the lines is less than 10 percent the total area of the upper surface of the chuck, and an area of the exposed fields is at least than 90 percent the total area of the upper surface of the chuck.

A thirtieth aspect according to any of the eighteenth through twenty-ninth aspects, further comprising depositing a barrier layer between the first conductive layer and the second conductive layer.

The invention claimed is:

1. An electrostatic chuck comprising:
   an insulating layer at an upper surface of the electrostatic chuck,
   a charge dissipation structure on the insulating layer, the charge dissipation structure comprising:
      a first conductive layer on the insulator layer having a first resistivity, and
      a second conductive layer over the first conductive layer, having a second resistivity, wherein the second resistivity is higher than the first resistivity,
   the charge dissipation structure comprising interconnecting topographies extending over an upper surface of the insulating layer, the interconnecting topographies including interconnected segments or lines that intersect to enclose and define multiple exposed areas of the insulating layer, and
   one or more electrodes beneath the insulating layer, wherein the interconnecting topographies are located directly above the one or more electrodes.

2. The electrostatic chuck of claim 1, further comprising embossments disposed on the first conductive layer, wherein the second conductive layer is disposed over the embossments.

3. The electrostatic chuck of claim 1, further comprising one or more seal rings disposed on the first conductive layer, wherein the second conductive layer is disposed over the one or more seal rings.

4. The electrostatic chuck of claim 1, wherein the second resistivity is below $1\times10^{-2}$ ohm meter.

5. The electrostatic chuck of claim 1, wherein the exposed fields of the insulating layer comprise geometric shapes and wherein a maximum distance between any location of the exposed fields to the nearest charge dissipation structure is less than 20 millimeters.

6. The electrostatic chuck of claim 1, wherein the first resistivity is less than $1\times10^{-5}$ ohm meter.

7. The electrostatic chuck of claim 1, wherein the charge dissipation structure has a total resistance below $1\times10^7$ ohms measured across a longest length of the charge dissipation structure.

8. The electrostatic chuck of claim 1, wherein a maximum distance between any location of the exposed field of the insulating layer and the nearest charge dissipation structure is less than 20 millimeters.

9. The electrostatic chuck of claim 1, wherein a maximum distance between any location of an exposed field and a charge dissipation structure is in a range of 2 to 15 millimeters.

10. The electrostatic chuck of claim 1, wherein the interconnecting topographies may be lines that have a width in a range from 0.1 to 1.5 millimeters.

11. The electrostatic chuck of claim 1, wherein the first conductive layer comprises aluminum, nickel, or a combination thereof.

12. The electrostatic chuck of claim 1, wherein the first conductive layer has a thickness in a range from 200 to 500 nanometers.

13. The electrostatic chuck of claim 1, wherein the second conductive layer comprises conductive material selected from diamond-like carbon, silicon carbide, doped carbon, and titanium nitride.

14. The electrostatic chuck of claim 1, wherein the second conductive layer has a thickness in a range from 500 to 1500 nanometers.

15. The electrostatic chuck of claim 1, wherein:
    an area of the interconnecting topographies is less than 10 percent the total area of the upper surface of the chuck, and
    an area of the exposed fields is at least 90 percent the total area of the upper surface of the chuck.

16. The electrostatic chuck of claim 1, further comprising one or more embossments disposed on an upper surface of the insulating layer, spaced from interconnecting topographies.

17. A method of producing an electrostatic chuck, the method comprising:
    on an insulating layer,
    forming a charge dissipation structure, the charge dissipation structure comprising:
       a first conductive layer on the insulating layer, the first conductive layer having a first resistivity, and
       a second conductive layer over the first conductive layer, the second conductive layer having a second resistivity, wherein the second resistivity is higher than the resistivity of the first conductive layer, and
    the charge dissipation structure comprising interconnecting topographies extending over the insulating layer upper surface, the interconnecting topographies including interconnected segments or lines that intersect to enclose and define multiple exposed areas of the insulating layer.

18. The method of claim 17, wherein the charge dissipation structure comprises:
    the first conductive layer,
    embossments disposed on the first conductive layer, and
    the second conductive layer over the first conductive layer and the embossments.

19. The method of claim 18, wherein the charge dissipation structure comprises:
    the first conductive layer,
    a seal ring or a portion of a seal ring disposed on the first conductive layer, and the second conductive layer over the first conductive layer and the seal ring or portion of the seal ring.

\* \* \* \* \*